United States Patent
Wang et al.

(10) Patent No.: US 7,663,949 B2
(45) Date of Patent: Feb. 16, 2010

(54) MEMORY ROW ARCHITECTURE HAVING MEMORY ROW REDUNDANCY REPAIR FUNCTION

(75) Inventors: Shih-Hsing Wang, Hsinchu (TW); Der-Min Yuan, Taipei County (TW)

(73) Assignee: Etron Technology, Inc., Hsinchu (TW)

( * ) Notice: Subject to any disclaimer, the term of this patent is extended or adjusted under 35 U.S.C. 154(b) by 325 days.

(21) Appl. No.: 11/829,088

(22) Filed: Jul. 27, 2007

(65) Prior Publication Data

US 2008/0316845 A1 Dec. 25, 2008

(30) Foreign Application Priority Data

Jun. 20, 2007 (TW) ............................... 96122035 A

(51) Int. Cl.
 *G11C 29/00* (2006.01)
(52) U.S. Cl. .................................. 365/200; 365/230.03
(58) Field of Classification Search ................. 365/200, 365/230.03
 See application file for complete search history.

(56) References Cited

U.S. PATENT DOCUMENTS 7,295,479 B2 * 11/2007 Yoon et al. ................... 365/200
7,304,900 B2 * 12/2007 Shibata et al. .............. 365/200
7,570,526 B2 * 8/2009 Han ........................... 365/200

* cited by examiner

*Primary Examiner*—Hoai V Ho
*Assistant Examiner*—Fernando N Hidalgo
(74) *Attorney, Agent, or Firm*—Winston Hsu

(57) ABSTRACT

The present invention discloses a memory row architecture having memory row redundancy repair function. The memory row architecture includes a plurality of normal memory sections and a plurality of redundancy memory sections, wherein a number of the plurality of normal memory sections is more than two, a number of the plurality of redundancy memory sections is equal to the number of the plurality of normal memory sections, and a redundancy memory section is implemented in one side of each of the plurality of normal memory sections. In addition, the plurality of normal memory sections and the plurality of redundancy memory sections respectively having an odd serial number make up a first memory row redundancy repair module, and the plurality of normal memory sections and the plurality of redundancy memory sections respectively having an even serial number make up a second memory row redundancy repair module.

3 Claims, 2 Drawing Sheets

MEMORY ROW ARCHITECTURE HAVING MEMORY ROW REDUNDANCY REPAIR FUNCTION

BACKGROUND OF THE INVENTION

1. Field of the Invention

The present invention relates to a memory row architecture having memory row redundancy repair function, and more particularly, to a memory row architecture having memory row redundancy repair function that implements a redundancy memory section in one side of each normal memory section.

2. Description of the Prior Art

In general, the conventional memory row architecture includes a so-called redundancy memory section besides a plurality of normal memory sections nowadays, wherein structure of the redundancy memory section is similar to that of the normal memory section, and the redundancy memory section is utilized for replacing memory units of the plurality of normal memory sections that are considered to be failed.

Please refer to FIG. 1. FIG. 1 shows a simplified block diagram of a memory row architecture 100 having memory row redundancy repair function according to a prior art. As shown in FIG. 1, the memory row architecture 100 includes a first normal memory section 111, a second normal memory section 112, a third normal memory section 113, a fourth normal memory section 114, a fifth normal memory section 115, a sixth normal memory section 116, a seventh normal memory section 117, an eighth normal memory section 118, a first redundancy memory section 121, and a second redundancy memory section 122, wherein the first redundancy memory section 121 is coupled to the first normal memory section 111 and the second redundancy memory section 122 is coupled to the eighth normal memory section 118. In addition, the first redundancy memory section 121 and the first normal memory section 111, the second normal memory section 112, the third normal memory section 113, and the fourth normal memory section 114 are coupled to each other so as to make up a first memory row redundancy repair module. When any normal memory section included in the above first memory row redundancy repair module is considered to be failed, the first memory row redundancy repair module utilizes the first redundancy memory section 121 to repair the failed normal memory sections. Similarly, the second redundancy memory section 122 and the eighth normal memory section 118, the fifth normal memory section 115, the sixth normal memory section 116, and the seventh normal memory section 117 are coupled to each other so as to make up a second memory row redundancy repair module. When any normal memory section included in the above second memory row redundancy repair module is considered to be failed, the second memory row redundancy repair module utilizes the second redundancy memory section 122 to repair the failed normal memory section.

However, since small signals of the first normal memory section 111 and the eighth normal memory section 118 will become smaller due to adding the first redundancy memory section 121 and the second redundancy memory section 122, the small signals of the first normal memory section 111 and the eighth normal memory section 118 will be different from small signals of the second normal memory section 112, the third normal memory section 113, the fourth normal memory section 114, the fifth normal memory section 115, the sixth normal memory section 116, the seventh normal memory section 117. This result is possible to bring down electrical performance and efficiency of the whole memory row architecture 100.

SUMMARY OF THE INVENTION

It is therefore one of the objectives of the present invention to provide a memory row architecture having memory row redundancy repair function that implements a redundancy memory section in one side of each normal memory section to solve the above problem.

According to an embodiment of the present invention, a memory row architecture having memory row redundancy repair function is disclosed. The memory row architecture includes a plurality of normal memory sections and a plurality of redundancy memory sections, wherein a number of the plurality of normal memory sections is more than two, a number of the plurality of redundancy memory sections is equal to the number of the plurality of normal memory sections, and a redundancy memory section is implemented in one side of each of the plurality of normal memory sections.

According to an embodiment of the present invention, a memory row architecture having memory row redundancy repair function is disclosed. The memory row architecture includes: a plurality of first normal memory sections; a plurality of second normal memory sections; a plurality of first redundancy memory sections, coupled to the plurality of first normal memory sections; and a plurality of second redundancy memory sections, coupled to the plurality of second normal memory sections; wherein the plurality of first normal memory sections are coupled to each other, the plurality of second normal memory sections are coupled to each other, a first normal memory section is implemented between two second normal memory sections, and a first redundancy memory section is implemented between two second redundancy memory sections.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular components. As one skilled in the art will appreciate, hardware manufacturers may refer to a component by different names. This document does not intend to distinguish between components that differ in name but in function. In the following discussion and in the claims, the terms "include", "including", "comprise", and "comprising" are used in an open-ended fashion, and thus should be interpreted to mean "including, but not limited to . . . ". The terms "couple" and "coupled" are intended to mean either an indirect or a direct electrical connection. Thus, if a first device couples to a second device, that connection may be through a direct electrical connection, or through an indirect electrical connection via other devices and connections.

The present invention discloses a memory row architecture having memory row redundancy repair function. The memory row architecture includes a plurality of normal memory sections and a plurality of redundancy memory sections, wherein a number of the plurality of normal memory sections is more than two, a number of the plurality of redundancy memory sections is equal to the number of the plurality of normal memory sections, and a redundancy memory section is implemented in one side of each of the plurality of normal memory sections. In addition, the number of the plurality of normal memory sections and the number of the plurality of redundancy memory sections are even numbers, and each of the plurality of normal memory sections and a redundancy memory section implemented in one side of the normal memory section are coupled to each other, wherein the plurality of normal memory sections and the plurality of redundancy memory sections respectively having an odd serial number make up a first memory row redundancy repair module, and the plurality of normal memory sections and the plurality of redundancy memory sections respectively having an even serial number make up a second memory row redundancy repair module. In addition, please note that the memory row architecture having memory row redundancy repair function disclosed in the present invention can applied in all kinds of memory chips nowadays.

Figure 1:
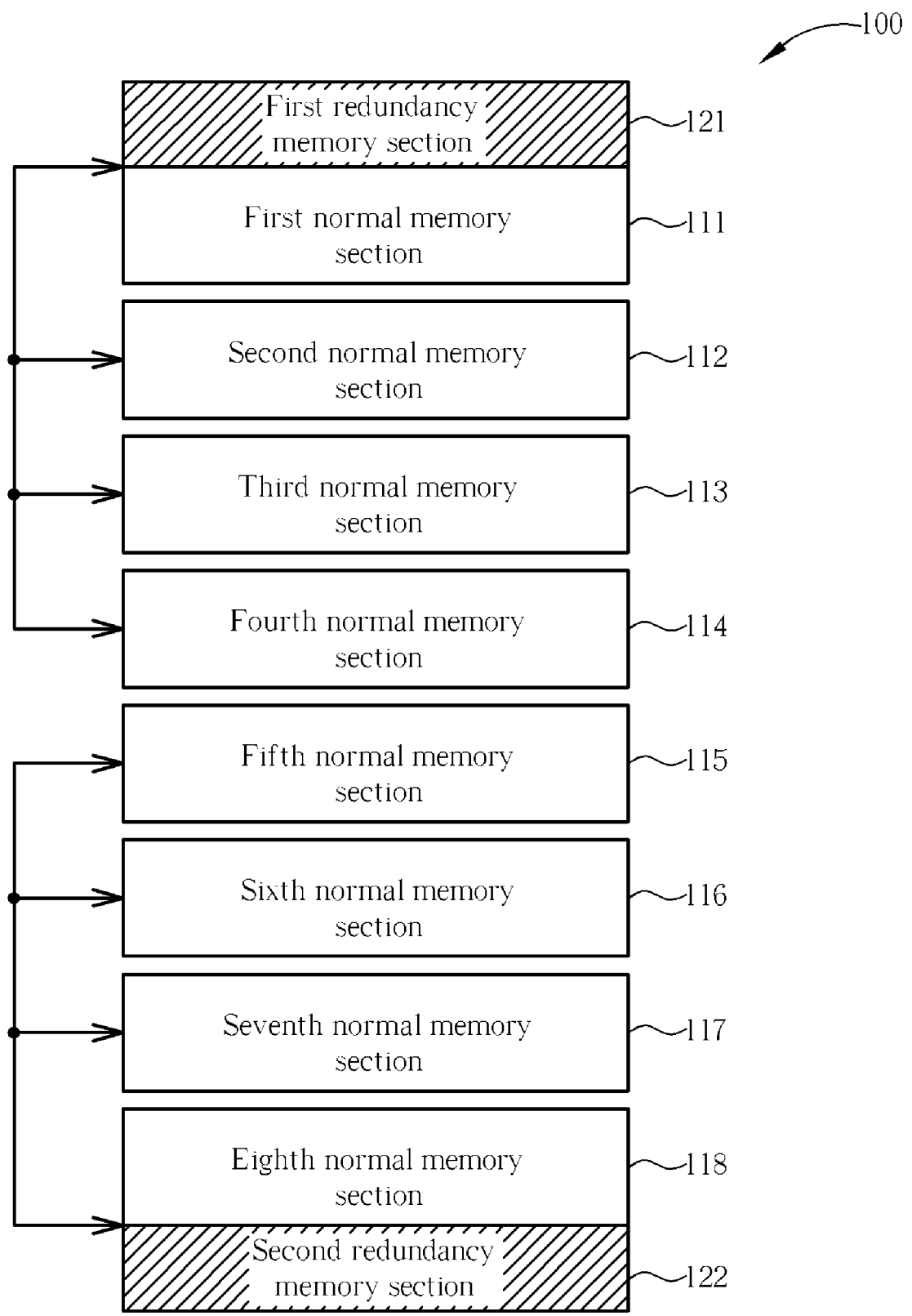
FIG. 1 shows a simplified block diagram of a memory row architecture having memory row redundancy repair function according to a prior art.
Figure 2:
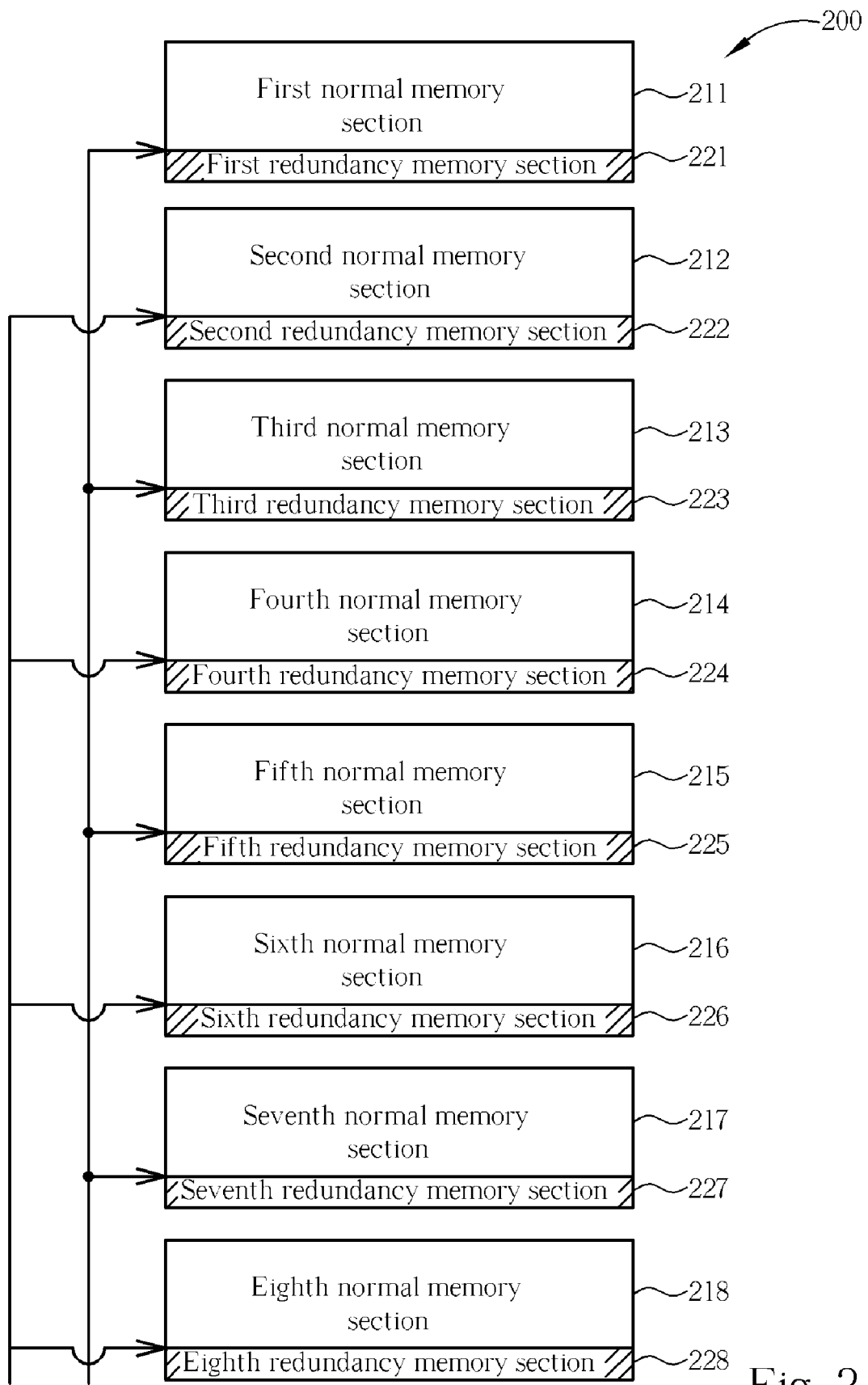
FIG. 2 shows a simplified block diagram of a memory row architecture having memory row redundancy repair function according to an embodiment of the present invention.

Please refer to FIG. 2. FIG. 2 shows a simplified block diagram of a memory row architecture 200 having memory row redundancy repair function according to an embodiment of the present invention. As shown in FIG. 2, the memory row architecture 200 includes a first normal memory section 211, a second normal memory section 212, a third normal memory section 213, a fourth normal memory section 214, a fifth normal memory section 215, a sixth normal memory section 216, a seventh normal memory section 217, an eighth normal memory section 218, a first redundancy memory section 221, a second redundancy memory section 222, a third redundancy memory section 223, a fourth redundancy memory section 224, a fifth redundancy memory section 225, a sixth redundancy memory section 226, a seventh redundancy memory section 227, and an eighth redundancy memory section 228, wherein the first redundancy memory section 221 is coupled to the first normal memory section 211, the second redundancy memory section 222 is coupled to the second normal memory section 212, the third redundancy memory section 223 is coupled to the third normal memory section 213, the fourth redundancy memory section 224 is coupled to the fourth normal memory section 214, the fifth redundancy memory section 225 is coupled to the fifth normal memory section 215, the sixth redundancy memory section 226 is coupled to the sixth normal memory section 216, the seventh redundancy memory section 227 is coupled to the seventh normal memory section 217, and the eighth redundancy memory section 228 is coupled to the eighth normal memory section 218. In addition, the first redundancy memory section 221 and the first normal memory section 211, the third redundancy memory section 223 and the third normal memory section 213, the fifth redundancy memory section 225 and the fifth normal memory section 215, and the seventh redundancy memory section 227 and the seventh normal memory section 217 are coupled to each other so as to make up a first memory row redundancy repair module. When memory units of any normal memory section included in the above first memory row redundancy repair module are considered to be failed, the first memory row redundancy repair module can utilize the redundancy memory sections coupled to the other normal memory sections in the normal operational status to repair the failed memory units. Similarly, the second redundancy memory section 222 and the second normal memory section 212, the fourth redundancy memory section 224 and the fourth normal memory section 214, the sixth redundancy memory section 226 and the sixth normal memory section 216, and the eighth redundancy memory section 228 and the eighth normal memory section 218 are also coupled to each other so as to make up a second memory row redundancy repair module. When memory units of any normal memory section included in the above second memory row redundancy repair module are considered to be failed, the second memory row redundancy repair module can utilize the redundancy memory sections coupled to the other normal memory sections in the normal operational status to repair the failed memory units. Please note that the above embodiment is only for illustration purposes and is not meant to be a limitation of the present invention.

In any case, the most important spirit of the technical content disclosed by the present invention is providing a memory row architecture capable of separately coupling a plurality of redundancy memory sections in a memory row to each of a plurality of normal memory sections with a uniform distribution, and thus a person of average skill in the pertinent art should be able to easily understand that various modifications and alterations of the device and method should fall into the disclosed scope of the present invention as long as being able to separately coupling the plurality of redundancy memory sections to each of the plurality of normal memory sections with a uniform distribution.

Briefly summarized, unlike the conventional memory row architecture has a memory row redundancy repair function by implementing all the redundancy memory sections in two normal memory sections of two outsides, since the memory row architecture having the memory row redundancy repair function disclosed by the present invention implements a redundancy memory section in one side of each normal memory section, thus the memory row architecture having the memory row redundancy repair function of the present invention can let the small signals of each normal memory section to be identical, so as to solve the problem caused by the conventional memory row architecture having the memory row redundancy repair function, and prevent the electrical performance and efficiency of the whole memory row architecture being affected.

Those skilled in the art will readily observe that numerous modifications and alterations of the device and method may be made while retaining the teachings of the invention.

What is claimed is:

1. A memory row architecture having memory row redundancy repair function, the memory row architecture comprising:
    a plurality of first normal memory sections;
    a plurality of second normal memory sections;
    a plurality of first redundancy memory sections, coupled to the plurality of first normal memory sections; and
    a plurality of second redundancy memory sections, coupled to the plurality of second normal memory sections;
    wherein the plurality of first normal memory sections are coupled to each other, the plurality of second normal memory sections are coupled to each other, the plurality of first normal memory sections are not coupled to the plurality of second normal sections, a first normal memory section is disposed between two adjacent second normal memory sections, and a first redundancy memory section is disposed between two adjacent second redundancy memory sections.

2. The memory row architecture of claim 1, wherein a total number of the plurality of first normal memory sections and the plurality of second normal memory sections and a total number of the plurality of first redundancy memory sections and the plurality of second redundancy memory sections are even numbers.

3. The memory row architecture of claim 1, wherein the plurality of first normal memory sections and the plurality of first redundancy memory sections make up a first memory row redundancy repair module; the plurality of second normal memory sections and the plurality of second redundancy memory sections make up a second memory row redundancy repair module; when at least one memory unit of one first normal memory section included in the first memory row redundancy repair module is considered to be failed, a first redundancy memory section coupled to another first normal memory section included in the first memory row redundancy repair module is utilized to repair the at least one failed memory unit of the first normal memory section; and when at least one memory unit of one second normal memory section included in the second memory row redundancy repair module is considered to be failed, a second redundancy memory section coupled to another second normal memory section included in the second memory row redundancy repair module is utilized to repair the at least one failed memory unit of the second normal memory section.

* * * * *